United States Patent [19]
Jeong

[11] Patent Number: 5,949,258
[45] Date of Patent: Sep. 7, 1999

[54] DATA HOLDING CIRCUIT

[75] Inventor: Seok-Yeon Jeong, Seoul, Rep. of Korea

[73] Assignee: LG Semicon Co., Ltd., Cheongju, Rep. of Korea

[21] Appl. No.: 08/987,198

[22] Filed: Dec. 9, 1997

[30] Foreign Application Priority Data

Jan. 8, 1997 [KR] Rep. of Korea ............... 97-241

[51] Int. Cl.[6] .................................................. G11C 27/02
[52] U.S. Cl. ............................................. 327/97; 327/91
[58] Field of Search ............................... 327/91, 93, 94, 327/95, 97, 185, 199, 261, 291, 57, 379; 326/56

[56] References Cited

U.S. PATENT DOCUMENTS

| | | | |
|---|---|---|---|
| 5,144,628 | 9/1992 | Sekiguchi | 371/40.1 |
| 5,231,313 | 7/1993 | Itoh | 327/299 |
| 5,557,225 | 9/1996 | Denham et al. | 327/199 |
| 5,559,753 | 9/1996 | Kocis | 365/236 |
| 5,646,553 | 7/1997 | Mitchell et al. | 326/86 |
| 5,656,959 | 8/1997 | Chang et al. | 327/105 |

*Primary Examiner*—My-Trang Nuton
*Attorney, Agent, or Firm*—Fleshner & Kim

[57] ABSTRACT

A data holding circuit is provided that reduces a setup time and hold time when a data is inputted to effectively transmit output data. The data holding circuit includes a latch unit that samples and holds input data, a delay unit that delays a control signal, and a three-phase buffer. The three-phase buffer is enabled based on a delayed control signal from the delay unit to hold data from the latch unit LAT and to transmit output data.

20 Claims, 3 Drawing Sheets

IMCLK

ID

MD

DMCLK

DELAY

OD

IMCLK

ID

DD

MD

DMCLK

OD

DATA HOLDING CIRCUIT

BACKGROUND OF THE INVENTION

1. Field of the Invention

The present invention relates to a data holding circuit, and in particular, to a data holding circuit that reduces a setup-hold time when data is inputted.

2. Background of the Related Art

FIG. 1 illustrates a related art data holding circuit, and FIGS. 2A–2C illustrate waveforms of signals of each element of the circuit of FIG. 1. As shown in FIG. 1, the related art data holding circuit includes a three-phase buffer TB into which input data ID is inputted. The three-phase buffer TB is enabled in accordance with a control signal IMCLK to output an output data OD.

The operation of the related art data holding circuit will now be described. When input data ID is inputted into three-phase buffer TB and then the control signal IMCLK is transited to a high level, the three-phase buffer TB is enabled to output the output data OD.

As shown in FIG. 2B, the input data ID should be inputted and setup before the control signal IMCLK is transited to a high level. The inputted data ID should also be held long enough after the three phase buffer TB is enabled to effectively output the output data OD, which is shown in FIG. 2C.

Therefore, the control signal IMCLK must setup early enough before the control signal IMCLK is transited to a high level for the input data ID to be effectively outputted as the output data OD. Similarly, after the control signal IMCLK is transited, the input data ID must be held, which disadvantageously extends the setup time and hold time.

In addition, when the output data OD is outputted via a data bus, the loading of the output data OD is large. Thus, a rising time until the output data OD transitions to a high level and a falling time until the output data OD transitions to a low level can be extended. Accordingly, an extended setup time and an extended hold time are needed to effectively obtain the output data OD using a data bus.

The above references are incorporated by reference herein where appropriate for appropriate teachings of additional or alternative details, features and/or technical background.

SUMMARY OF THE INVENTION

An object of the present invention is to provide a data holding circuit that overcomes at least the problems and disadvantages encountered in the related art.

Another object of the present invention is to provide a data holding circuit that reduces a setup time and a hold time when data is inputted.

A further object of the present invention is to provide a data holding circuit that reduces a setup time and a hold time when inputting and effectively outputting data via a data bus.

To achieve these and other objects in whole or in part, there is provided a data holding circuit according to the present invention that includes a latch unit for sampling and holding an input data, a delay unit for delaying a control signal, and a three-phase buffer that is enabled based on a delayed control signal from the delay unit to hold data from the latch unit and then output the data.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
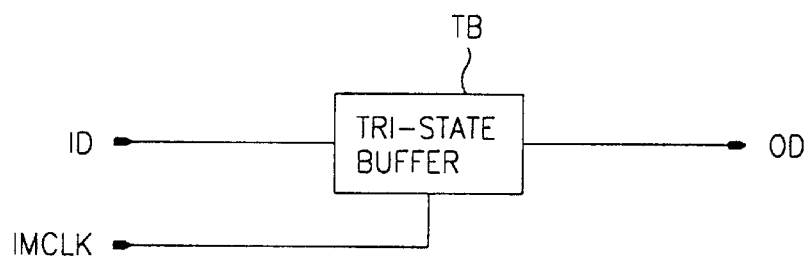
FIG. 1 is a circuit diagram illustrating a related art data holding circuit.
Figure 2A:
FIGS. 2A–2C are diagrams illustrating waveforms of element signals of the circuit of FIG. 1.
Figure 2B:
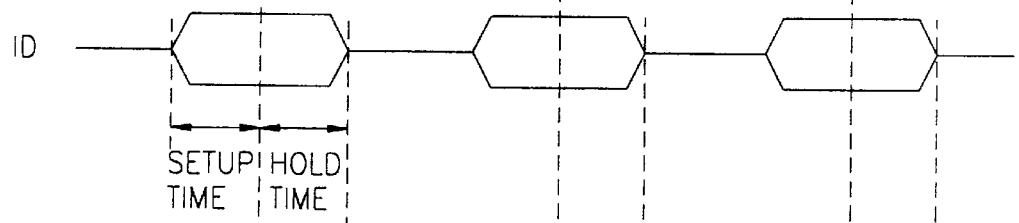
Figure 2C:
Figure 3:
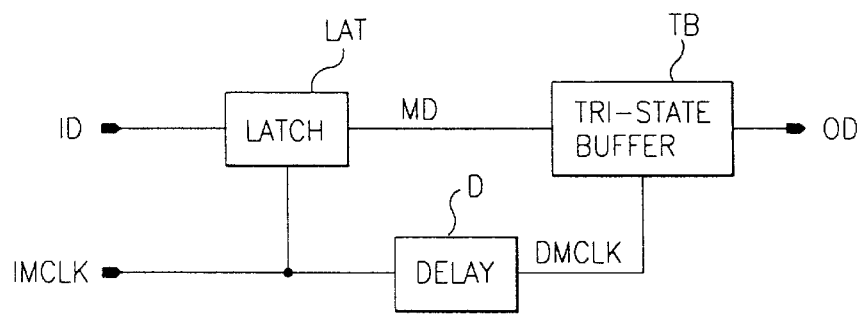
FIG. 3 is a circuit diagram illustrating a data holding circuit according to a preferred embodiment of the present invention.

As shown in FIG. 3, a first preferred embodiment of a data holding circuit according to the present invention includes a latch unit LAT, a delay unit and a threephase buffer. The latch unit LAT samples and holds an input data signal ID based on a control signal IMCLK. The delay unit D delays the control signal IMCLK and a threephase buffer TB is enabled based on a delayed control signal DMCLK from the delay unit D to hold a holding data MD from the latch unit LAT.

Figure 4A:
FIGS. 4A–4E are diagrams illustrating waveforms of signals of the circuit of FIG. 3.
Figure 4B:
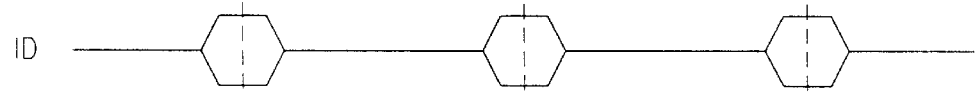
Figure 4C:
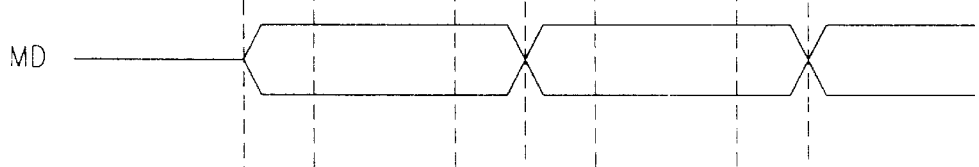

Operations of the first preferred embodiment of the data holding circuit according to the present invention will now be described. The latch unit LAT is enabled when the control signal IMCLK is transited to a high level. When enabled, the latch unit LAT samples and holds the input data ID, which is shown in FIG. 4B. The latch unit LAT outputs held data MD as shown in FIG. 4C.

Figure 4D:
Figure 4E:

The delay unit D delays the control signal IMCLK and outputs the delayed control signal DMCLK as shown in FIG. 4D. The three-phase buffer TB is enabled when the delayed control signal DMCLK from the delay unit D is transited to a high level. The three-phase buffer TB holds the data MD and transmits the output data OD, which is shown in FIG. 4E.

Figure 5:
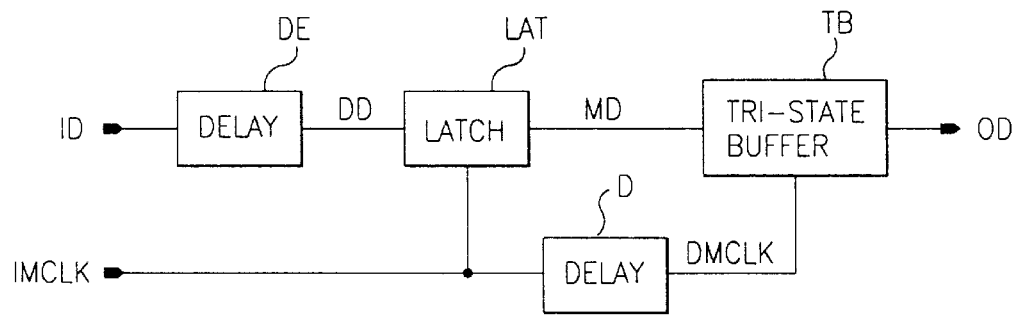
FIG. 5 is a circuit diagram illustrating a data holding circuit according to another preferred embodiment of the present invention.

FIG. 5 illustrates a second preferred embodiment of a data holding circuit according to the present invention. The second preferred embodiment includes the latch LAT, the delay D and the tri-state buffer TB as described above with respect to FIG. 3. Accordingly, the detailed description will be omitted. As shown in FIG. 5, the second preferred embodiment of the data holding circuit further includes a delay unit DE for delaying the input data ID before the input data ID is inputted into the latch unit LAT.

Figure 6A:
FIGS. 6A–6F are diagrams illustrating waveforms of signals of the circuit of FIG. 5.
Figure 6B:
Figure 6C:
Figure 6D:

Operations of the data holding circuit according to the second preferred embodiment will now be described. The delay unit DE delays the input data ID, which is shown in FIG. 6B, and outputs delayed data DD. Delayed data DD is delayed after the input data ID by a first delay time as shown in FIG. 6C. The latch unit LAT is enabled when the control signal IMCLK is transited to a high level. The latch unit LAT samples and holds the delayed data DD and then outputs a held data MD as shown in FIG. 6D.

Figure 6E:
Figure 6F:
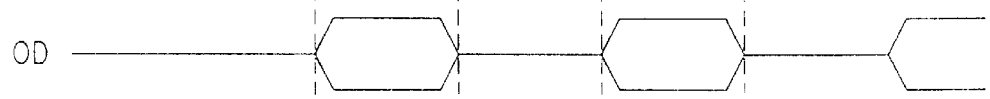

The delay unit D delays the control signal IMCLK by a second delay time and outputs the delayed control signal DMCLK as shown in FIG. 6E. The first delay time of the delay unit DE according to the second preferred embodiment must be shorter than the second delay time of the delay unit D as respectively shown in FIGS. 6C and 6E. The three-phase buffer TB is enabled when the delayed control signal DMCLK is transited to a high level. The three-phase buffer TB holds the data and outputs the output data OD as shown in FIG. 6F.

In the preferred embodiments of the data holding circuit according to the present invention, the input data ED is sampled by the latch unit LAT and the held data MD held is inputted into the three phase TB. Thus, the three-phase buffer TB can effectively transmit the output data OD by providing enough setup time even when the hold time is short.

In addition, in the second preferred embodiment, the input data ID is delayed by the delay unit DE before the input data ID is inputted into the latch unit LAT as the delayed data DD. Thus, the three-phase buffer TB can effectively transmit the output data OD even when the hold time of the input data ID becomes zero (0) as shown in FIG. 6B. Since the held data MD sampled by the latch unit LAT is inputted into the three phase buffer TB, in the case that the output data OD is outputted via the data bus, it is possible to control the control signal IMCLK to reduce the setup-hold time of the input data ID.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A data holding circuit, comprising:
   a latch that enables based on a control signal to latch input data;
   a first delay circuit that delays the control signal and outputs a delayed control signal; and
   a buffer directly connected to the latch and the first delay circuit that outputs the latched data based on the delayed control signal received from the first delay circuit.

2. The circuit of claim 1, wherein the buffer transmits the latched input data even when a holding time of the input signal is reduced.

3. The circuit of claim 2, wherein a combined setup and hold time of the input data is reduced.

4. The circuit of claim 1, further comprising a second delay circuit that delays the input data before the input data is inputted into the latch.

5. The circuit of claim 4, wherein the second delay circuit delays the input data less than the first delay circuit delays the control signal.

6. The circuit of claim 4, wherein the buffer transmits the latched input data even when a holding time of the input signal is reduced, and wherein the control signal is a clock signal.

7. The circuit of claim 4, wherein the buffer transmits the latched input data even when a holding time of the input signal is substantially zero.

8. The circuit of claim 4, wherein a setup time and a hold time of the input data is reduced.

9. A data holding circuit, comprising:
   a latch that in response to a first clock signal latches an input data;
   a first delay circuit that receives the first clock signal and outputs a delayed first clock signal; and
   a buffer directly coupled to the latch that outputs the input data received from the latch in response to the delayed first clock signal.

10. The circuit of claim 9, wherein the buffer transmits the input signal even when a holding time of the input signal is reduced.

11. The circuit of claim 9, further comprising a second delay circuit that delays the input data before the input data is inputted into the latch.

12. The circuit of claim 11, wherein the second delay circuit delays the input data less than the first delay circuit delays the first clock signal.

13. The circuit of claim 11, wherein the buffer transmits the input signal even when a setup time of the input signal is substantially zero.

14. The circuit of claim 9, wherein a setup time and a hold time of the input data is reduced.

15. The circuit of claim 9, wherein the latch further samples the input data.

16. The circuit of claim 9, wherein the first clock signal is a control signal.

17. The circuit of claim 9, wherein the buffer is directly connected to the first delay circuit, and wherein the latch receives the first clock signal at a clock input.

18. A data holding circuit, comprising:
   a latch having input, output and control electrodes, wherein the input electrode of the latch is coupled to receive an input data;
   a delay having input and output electrodes, wherein the control electrode of the latch and the input electrode of the delay are connected together and receive a clock signal; and
   a tri-state buffer having input, output and control electrodes, wherein the output electrode of the latch and the input electrode of the tri-state buffer are directly connected together, wherein the output electrode of the delay and the control electrode of the tri-state buffer are connected together, and wherein the tri-state buffer receives a delayed clock signal and outputs the input data using the output electrode according to the delayed clock signal.

19. The data holding circuit of claim 18, wherein the tri-state buffer reduces a setup time and a holding time of the input signal.

20. The data holding circuit of claim 19, further comprising an additional delay having input and output electrodes, wherein the output electrode of the additional delay and the input electrode of the latch are coupled together.

* * * * *